US009627431B2

(12) United States Patent
Mori et al.

(10) Patent No.: US 9,627,431 B2
(45) Date of Patent: *Apr. 18, 2017

(54) SOLID-STATE IMAGING DEVICE

(71) Applicant: Panasonic Intellectual Property Management Co., Ltd., Osaka (JP)

(72) Inventors: Mitsuyoshi Mori, Kyoto (JP); Ryohei Miyagawa, Kyoto (JP); Yoshiyuki Ohmori, Osaka (JP); Yoshihiro Sato, Osaka (JP); Yutaka Hirose, Kyoto (JP); Yusuke Sakata, Osaka (JP); Toru Okino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/572,046

(22) Filed: Dec. 16, 2014

(65) Prior Publication Data

US 2015/0137199 A1    May 21, 2015

Related U.S. Application Data

(63) Continuation of application No. PCT/JP2013/001601, filed on Mar. 12, 2013.

(30) Foreign Application Priority Data

Jun. 27, 2012    (JP) .................................. 2012-144764

(51) Int. Cl.
*H01L 27/146*    (2006.01)
*H01L 27/30*    (2006.01)

(52) U.S. Cl.
CPC .... *H01L 27/14643* (2013.01); *H01L 27/1461* (2013.01); *H01L 27/1463* (2013.01);
(Continued)

(58) Field of Classification Search
CPC .......... H01L 27/1461; H01L 27/14612; H01L 27/14636; H01L 27/14643;
(Continued)

(56) References Cited

U.S. PATENT DOCUMENTS 6,407,440 B1 *   6/2002   Rhodes ............. H01L 27/14603
                                                            257/218
8,120,684 B2     2/2012   Arakawa
(Continued)

FOREIGN PATENT DOCUMENTS

JP    2000-83198    3/2000
JP    2004-55590    2/2004
(Continued)

OTHER PUBLICATIONS

International Search Report issued in International Application No. PCT/JP2013/001601 on May 14, 2013.
(Continued)

*Primary Examiner* — Jarrett Stark
*Assistant Examiner* — Bitew Dinke
(74) *Attorney, Agent, or Firm* — Wenderoth, Lind & Ponack, L.L.P.

(57) ABSTRACT

A solid-state imaging device according to the present disclosure includes: a charge storage region that stores a signal charge obtained through photoelectric conversion in a photoelectric conversion film; an amplification transistor that amplifies the signal charge stored in the charge storage region in a corresponding pixel; a contact plug that is electrically connected to the charge storage region and contains a semiconductor material; and a line that is disposed above the contact plug and contains a semiconductor material. The contact plug and the charge storage region are
(Continued)

electrically connected, and the contact plug and a gate electrode of the amplification transistor are electrically connected via the line.

12 Claims, 9 Drawing Sheets

(52) U.S. Cl.
CPC .... *H01L 27/1464* (2013.01); *H01L 27/14612* (2013.01); *H01L 27/14636* (2013.01); *H01L 27/14645* (2013.01); *H01L 27/307* (2013.01)

(58) Field of Classification Search
CPC ........... H01L 27/14645; H01L 27/1463; H01L 27/1464; H01L 27/14609; H01L 27/14689
See application file for complete search history.

(56) References Cited

U.S. PATENT DOCUMENTS

| | | | |
|---|---|---|---|
| 8,390,036 B2 | 3/2013 | Goto | |
| 8,691,637 B2 | 4/2014 | Arakawa | |
| 2002/0011614 A1* | 1/2002 | Rhodes | H01L 27/14609 257/291 |
| 2005/0051701 A1* | 3/2005 | Hong | H01L 27/14609 250/214.1 |
| 2006/0082669 A1 | 4/2006 | Inoue et al. | |
| 2006/0214199 A1* | 9/2006 | Inoue | H01L 27/14893 257/292 |
| 2007/0194387 A1* | 8/2007 | Dyer | H01L 21/823418 257/369 |
| 2009/0225209 A1* | 9/2009 | Arakawa | H01L 27/14609 348/306 |
| 2011/0049665 A1 | 3/2011 | Goto | |
| 2011/0216212 A1* | 9/2011 | Watanabe | H04N 5/228 348/222.1 |
| 2012/0115270 A1 | 5/2012 | Arakawa | |
| 2012/0200752 A1* | 8/2012 | Matsunaga | H01L 27/14609 348/300 |
| 2013/0107095 A1 | 5/2013 | Yarino et al. | |
| 2013/0113060 A1* | 5/2013 | Matsunaga | H01L 27/14632 257/431 |
| 2013/0277719 A1* | 10/2013 | Kao | H01L 21/2652 257/288 |
| 2013/0292548 A1* | 11/2013 | Agranov | H01L 27/307 250/208.1 |
| 2013/0314574 A1* | 11/2013 | Ishii | H01L 27/1461 348/302 |
| 2014/0103400 A1* | 4/2014 | Sakata | H01L 27/1463 257/222 |
| 2014/0151754 A1 | 6/2014 | Arakawa | |
| 2014/0246706 A1* | 9/2014 | Mori | H01L 27/14609 257/222 |
| 2015/0070549 A1 | 3/2015 | Yarino et al. | |
| 2015/0123180 A1* | 5/2015 | Sato | H04N 5/363 257/292 |
| 2015/0124134 A1* | 5/2015 | Suzuki | H01L 27/14609 348/300 |

FOREIGN PATENT DOCUMENTS

| | | | | |
|---|---|---|---|---|
| JP | 2006-120711 | | 5/2006 | |
| JP | 2007-250956 | | 9/2007 | |
| JP | 2008-98541 | | 4/2008 | |
| JP | 2008-227357 | | 9/2008 | |
| JP | 2009-212339 | | 9/2009 | |
| JP | 2010-40650 | | 2/2010 | |
| JP | 4444371 | | 3/2010 | |
| JP | 2012-19166 | | 1/2012 | |
| JP | WO 2012005014 A1 * | 1/2012 | ....... H01L 27/14632 |
| JP | 2012-60076 | | 3/2012 | |
| JP | WO 2012176390 A1 * | 12/2012 | ......... H01L 27/1463 |
| WO | 2012/005011 A1 | | 1/2012 | |

OTHER PUBLICATIONS

Office Action and Search Report issued in corresponding Chinese Patent Application No. 201380032847.1, dated Mar. 1, 2017.

* cited by examiner

SOLID-STATE IMAGING DEVICE

CROSS REFERENCE TO RELATED APPLICATIONS

This is a continuation application of PCT International Application No. PCT/JP2013/001601 filed on Mar. 12, 2013, designating the United States of America, which is based on and claims priority of Japanese Patent Application No. 2012-144764 filed on Jun. 27, 2012. The entire disclosures of the above-identified applications, including the specifications, drawings and claims are incorporated herein by reference in their entirety.

FIELD

The present disclosure relates to a solid-state imaging device having a plurality of pixels that are arranged in an array and include a photoelectric conversion unit.

BACKGROUND

In recent years, metal oxide semiconductor (MOS) solid-state imaging devices have been mounted on mobile device cameras, vehicle-mounted cameras and surveillance cameras.

Since a high-resolution imaging capability is demanded of the solid-state imaging devices, these devices need to achieve a finer design and a greater number of pixels. In conventional solid-state imaging devices, increasingly finer pixels bring about the size reduction of photodiodes. Accordingly, the decrease in a saturation signal amount and the reduction of an aperture ratio cause a problem of decreasing sensitivity.

As a solid-state imaging device for solving this problem, a layered solid-state imaging device has been proposed. In the layered solid-state imaging device, a photoelectric conversion film is laid on an outermost surface of a semiconductor substrate. Light enters from above the layered films. The above-noted solid-state imaging device has a configuration in which an electric charge generated by photoelectric conversion in the photoelectric conversion film is read out using a charge coupled device (CCD) circuit or a complementary MOS (CMOS) circuit in the semiconductor substrate.

Patent Literature (PTL) 1 discloses a conventional layered solid-state imaging device.

FIG. 7 is a pixel circuit diagram illustrating the layered solid-state imaging device described in PTL 1. In a pixel circuit illustrated in FIG. 7, a charge storage region (FD) and a pixel electrode 515 are electrically connected, and a voltage of the charge storage region varies according to the intensity of incident light. Also, the charge storage region is electrically connected to a gate electrode of an amplification transistor 517b. Thus, this pixel circuit can amplify the voltage variation in the charge storage region and read it out to a signal line 517d via a selection transistor 517c.

In the above-described layered solid-state imaging device, the photoelectric conversion film is laid over a wiring layer used for a read-out circuit and a signal processing circuit. The electric charge obtained in the photoelectric conversion layer is stored in the charge storage region provided in the semiconductor substrate. Thus, the electric charge obtained in the photoelectric conversion layer is transferred to the charge storage region via a contact plug.

PTL 2 discloses a structure of the contact plug.

FIG. 8 is a sectional view illustrating a pixel portion of a solid-state imaging device described in PTL 2. If the contact plug (connection hole) is formed of a metallic material, an alloy formation of the metallic material and silicon involves a crystal defect, which serves as a source of noise generation. Accordingly, to address the problem of the crystal defect, PTL 2 proposes a configuration in which a polysilicon contact is formed in an FD portion 602, thereby reducing a noise.

CITATION LIST

Patent Literature

[PTL 1] Japanese Patent No. 4444371
[PTL 2] Japanese Unexamined Patent Application Publication No. 2008-227357

SUMMARY

Technical Problem

However, the conventional configuration described above has no light-shielding region above the charge storage region. Thus, out of the light that has entered the photoelectric conversion layer, light that is not absorbed by and passes through the photoelectric conversion layer enters the charge storage region, thus causing a problem of noise charge generation.

In view of the problems described above, one non-limiting and explanatory embodiment provides a solid-state imaging device in which a total number of lines does not increase even with a finer design and a noise is suppressed in a charge storage region.

Solution to Problem

A solid-state imaging device according to one aspect of the present disclosure includes a semiconductor substrate; a plurality of pixels that are disposed in a matrix above the semiconductor substrate; a pixel electrode that is disposed in each of the pixels and electrically isolated from an adjacent one of the pixels; a photoelectric conversion film that is disposed above the pixel electrode and performs photoelectric conversion of light into a signal charge; a charge storage region that is disposed in each of the pixels, is electrically connected to the pixel electrode, and stores the signal charge obtained through the photoelectric conversion in the photoelectric conversion film; an amplification transistor that is disposed in each of the pixels and amplifies the signal charge stored in the charge storage region in a corresponding one of the pixels; a first contact plug that contains a semiconductor material; and a line that is disposed above the first contact plug and contains a semiconductor material. The first contact plug and the charge storage region are electrically connected, the first contact plug and a gate electrode of the amplification transistor are electrically connected via the line, and the line is disposed so as to cover at least a portion of the charge storage region in a plan view of the solid-state imaging device.

With the above configuration, the line that electrically connects the charge storage region and the gate electrode of the amplification transistor and is formed of the semiconductor material is provided. The line covers the charge storage region, thereby forming on the charge storage region a light-shielding region for blocking the light that has passed through the photoelectric conversion film. Consequently, the generation of the noise charge in the charge storage region can be suppressed. Furthermore, if the line is formed of a metallic material, reflected light is scattered. On the other hand, if the line is formed of a semiconductor material, incident light is mainly absorbed, making it possible to suppress an influence of scattered light. Conventionally, the line for electrically connecting the charge storage region and the gate electrode of the amplification transistor has been provided in a metal wiring layer above the contact plug. In contrast, with the above-described mode according to the present disclosure, the line for electrically connecting the charge storage region and the gate electrode of the amplification transistor need not be provided separately as the metal wiring layer, so that an increase in the number of wiring layers can be suppressed. The reduction of the number of wiring layers leads to a miniaturization of the solid-state imaging device. Additionally, the above-noted line for electrical connection can be formed in the same step of forming the contact plug formed of the semiconductor material, resulting in the simplification of manufacturing steps and the reduction of manufacturing costs.

Advantageous Effects

With a solid-state imaging device according to the present disclosure, it is possible to provide a low-cost solid-state imaging device that suppresses a noise generated in a charge storage region and is also adaptable to a finer pixel size without increasing the number of wiring layers.

BRIEF DESCRIPTION OF DRAWINGS

These and other objects, advantages and features of the invention will become apparent from the following description thereof taken in conjunction with the accompanying drawings that illustrate a specific embodiment disclosed herein.

DESCRIPTION OF EMBODIMENT

In the following, an embodiment will be described in detail based on the accompanying drawings. It should be noted that the present disclosure is not limited to the following embodiment. Also, the following embodiment can be modified as necessary as long as an advantageous effect of the present disclosure is produced. Furthermore, the following embodiment can also be combined with other embodiments. Moreover, any of the embodiment described below will illustrate one specific example of the present disclosure. The numerical values, shapes, materials, structural components, the arrangement and connection of the structural components, steps and the order of the steps mentioned in the following embodiment are merely an example and not intended to limit the present disclosure. Accordingly, among the structural components in the following embodiment, the one that is not recited in any independent claim exhibiting the most generic concept of the present disclosure will be described as an arbitrary structural component constituting a more preferable mode.

First, the configuration of a solid-state imaging device according to an embodiment will be described.

Figure 1:
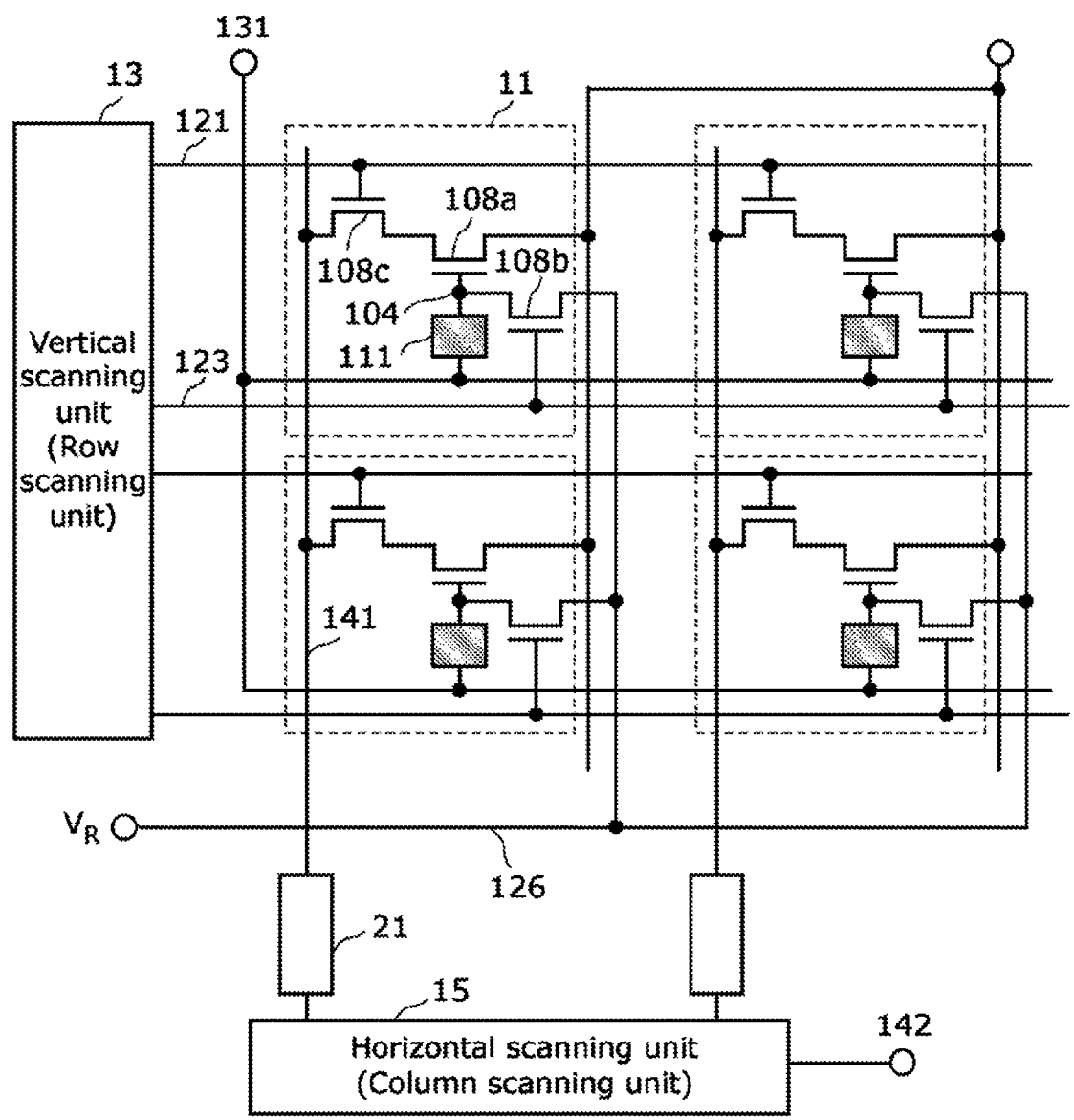
FIG. 1 illustrates a circuit configuration showing a solid-state imaging device according to an embodiment.

FIG. 1 illustrates a circuit configuration showing a solid-state imaging device according to an embodiment. As illustrated in FIG. 1, the solid-state imaging device according to an embodiment includes a plurality of pixels 11 that are disposed in a matrix above a semiconductor substrate, a vertical scanning unit (also referred to as a row scanning unit) 13 that supplies various timing signals to the pixels 11, a horizontal scanning unit (also referred to as a column scanning unit) 15 that sequentially reads out the signals from the pixels 11 to a horizontal output terminal 142, column signal lines 141 that are provided for respective columns, and resent lines 126 that are provided for respective columns for resetting the pixels 11 to a dark state. Incidentally, although FIG. 1 illustrates two rows and two columns of the pixels 11, the number of rows and columns may be set freely.

Furthermore, each of the pixels 11 includes a photoelectric conversion unit 111, an amplification transistor 108a whose gate is connected to the photoelectric conversion unit 111, a reset transistor 108b whose drain is connected to the photoelectric conversion unit 111, and a selection transistor 108c that is connected in series with the amplification transistor 108a.

The photoelectric conversion unit 111 is connected between (i) the gate of the amplification transistor 108a and the drain of the reset transistor 108b and (ii) a photoelectric conversion unit control line 131.

The gate of the amplification transistor 108a is connected to a pixel electrode, and the amplification transistor 108a outputs a signal voltage according to a voltage of the pixel electrode to the column signal line 141 via the selection transistor 108c.

One of a source and the drain of the reset transistor 108b is connected to the pixel electrode, and the other of the source and the drain thereof is connected to a corresponding one of the resent lines 126. A gate of the reset transistor 108b is connected to the vertical scanning unit 13 via a reset control line 123.

A gate of the selection transistor 108c is connected to the vertical scanning unit 13 via an address control line 121. The address control line 121 and the reset control line 123 are provided for each row.

The photoelectric conversion unit control line 131 is shared among all of the pixels. The column signal line 141 is provided for each column, and connected to the horizontal scanning unit 15 via a column signal processing unit 21. The column signal processing unit 21 performs noise suppression signal processing represented by correlated double sampling, and analog/digital conversion processing.

Furthermore, the amplification transistor 108a, the selection transistor 108c, and the reset transistor 108b are disposed above the semiconductor substrate that is formed of silicon. Each of the amplification transistor 108a, the reset transistor 108b, and the selection transistor 108c includes the drain and source, which are diffusion layers, and a gate electrode. The source of the amplification transistor 108a and the drain of the selection transistor 108c are formed of a common diffusion layer. The amplification transistor 108a and the reset transistor 108b are separated by an element isolation region.

Moreover, on the semiconductor substrate 101, an insulating film is formed in such a manner as to cover each of the transistors. The photoelectric conversion unit 111 is formed on the insulating film. The photoelectric conversion unit 111 is formed of an organic material, or a material including a semiconductor represented by amorphous silicon and germanium, and includes the photoelectric conversion film that performs photoelectric conversion, the pixel electrode that is formed on a lower surface of the photoelectric conversion film, and a transparent electrode that is formed on an upper surface of the photoelectric conversion film. The pixel electrode is connected to the gate electrode of the amplification transistor 108a and the diffusion layer serving as the source of the reset transistor 108b via a contact. The diffusion layer connected with the pixel electrode functions as a charge storage region.

Figure 2A:
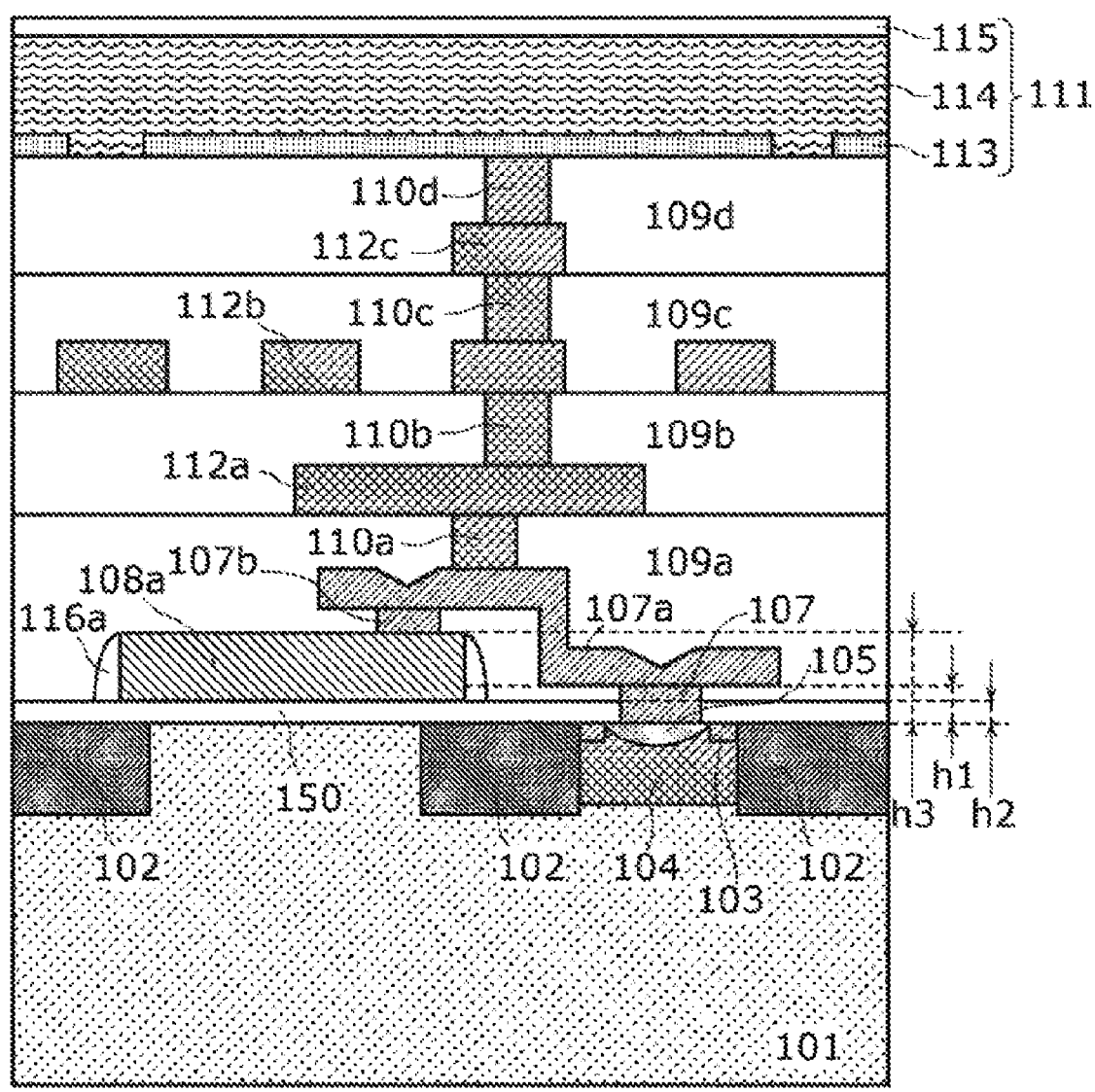
FIG. 2A illustrates a first example of a sectional view showing a pixel of the solid-state imaging device according to an embodiment.
Figure 2B:
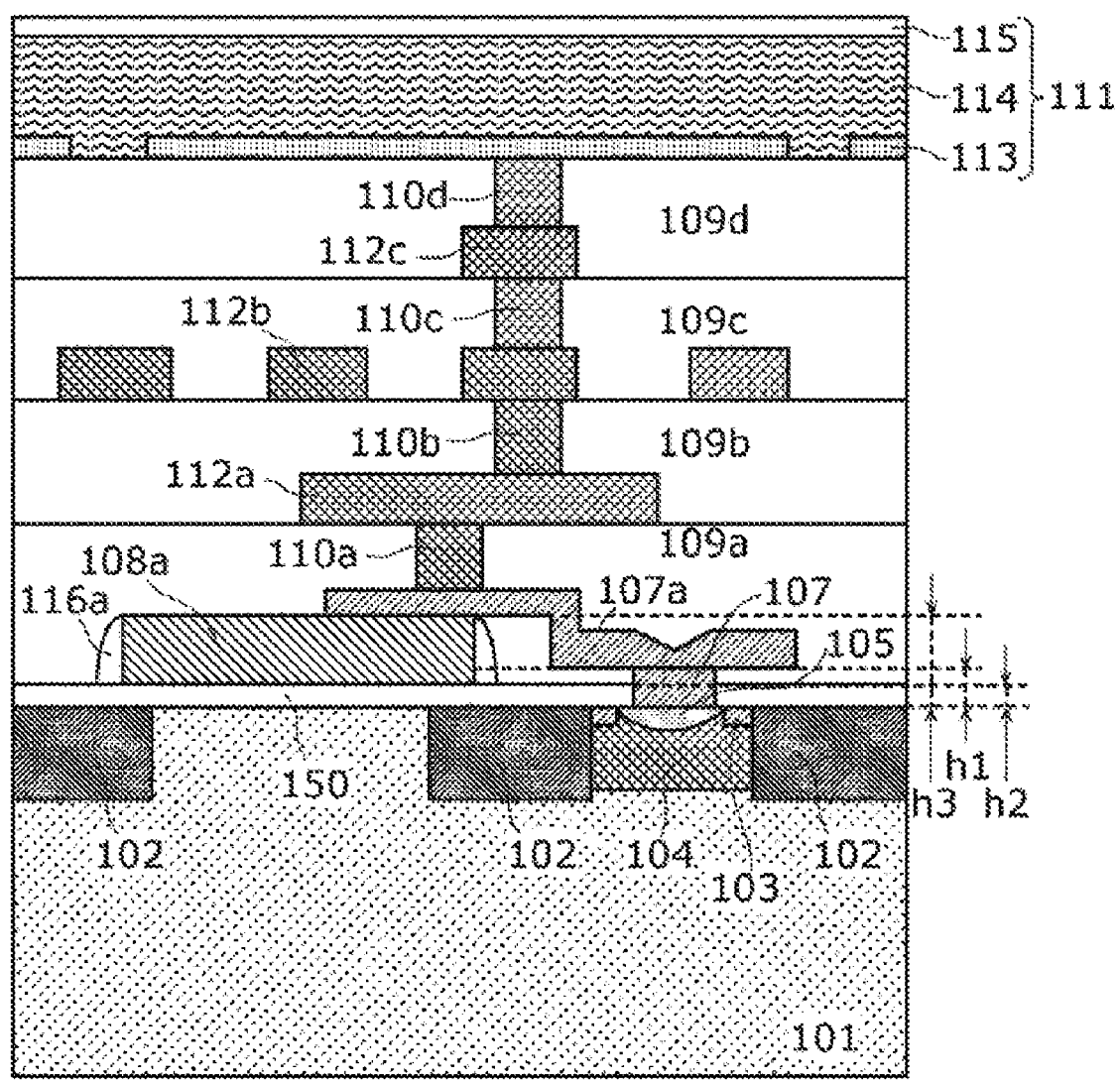
FIG. 2B illustrates a second example of the sectional view showing the pixel of the solid-state imaging device according to an embodiment.

FIG. 2A illustrates a first example of a sectional view showing a pixel of the solid-state imaging device according to an embodiment, and FIG. 2B illustrates a second example of a sectional view showing the pixel of the solid-state imaging device according to an embodiment. FIGS. 2A and 2B are one example of a sectional view illustrating an arrangement of the photoelectric conversion unit 111, the charge storage region 104, and the amplification transistor 108a that are included in the pixel 11. FIGS. 2A and 2B are the same except for how the gate electrode of the amplification transistor 108a and a line 107a are connected.

As illustrated in FIG. 2A, the pixel 11 includes a p$^+$-type element isolation region 102, an n$^-$-type charge storage region 104, a contact plug 107, an n-type impurity diffusion layer 105, the gate electrode of the amplification transistor 108a, the line 107a, a contact plug 107b, contact plugs 110a to 110d, insulating layers 109a to 109d, the pixel electrode 113, the photoelectric conversion layer 114, the transparent electrode 115, and a sidewall layer 116a that are formed above a p-type semiconductor substrate 101.

The p$^+$-type element isolation region 102 isolates transistors from each other. The n$^-$-type charge storage region 104 stores a signal charge from the photoelectric conversion film 114. The contact plug 107 is a first contact plug formed of an n$^+$-type semiconductor material. The impurity diffusion layer 105 is formed by diffusing impurities from the contact plug 107. The gate electrode of the amplification transistor 108a is formed such that a gate oxide film 150 is provided between the gate electrode and the semiconductor substrate 101. The line 107a is formed of an n$^+$-type semiconductor material that electrically connects the gate electrode of the amplification transistor 108a and the contact plug 107. The contact plug 107b is formed of an n-type semiconductor material that electrically connects the gate electrode of the amplification transistor 108a and the line 107a. The contact plugs 110a to 110d are metal plugs formed of a metallic material such as W, Cu or Al. Here, the contact plug 110a is a second contact plug that is disposed on an upper surface of the line 107a and electrically connects to the line 107a. The pixel electrode 113 of each pixel is isolated from that of an adjacent one of the pixels, and connected to the charge storage region 104 and the gate electrode of the amplification transistor 108a. The photoelectric conversion film 114 generates a signal charge according to an amount of incident light. The transparent electrode 115 is an electrode for applying to the photoelectric conversion film 114 a predetermined voltage necessary for photoelectric conversion. The sidewall layer 116a covers lateral surfaces of the gate electrode of the amplification transistor 108a.

It should be noted that a material of the sidewall layer 116a may be of, for example, a single layer structure formed of SiN or $SiO_2$, a double layer structure formed of SiN and $SiO_2$, or a structure having three or more layers.

Although the element isolation region 102 is illustrated having a p$^+$-type implantation isolation structure obtained by implanting p-type impurities at a high concentration, it may be an element isolation region formed by embedding an oxide film (shallow trench isolation) and can produce an equivalent effect.

Furthermore, although the contact plug 107, the line 107a, and the contact plug 107b contain polysilicon in the present embodiment, they may be formed of a semiconductor material containing an element other than a group IV element, such as Ge or GaAs. The impurity concentration of the contact plug 107, the line 107a, and the contact plug 107b may range from $10^{19}/cm^3$ to $10^{21}/cm^3$.

The photoelectric conversion film 114 generates an electric charge according to an amount of received light. The generated electric charge is stored in the charge storage region 104 via the pixel electrode 113. The voltage to be applied to the gate electrode of the amplification transistor 108a increases according to the signal charge stored in the charge storage region 104.

The amplification transistor 108a amplifies the signal charge stored in the charge storage region 104. A predetermined voltage is applied to the gate electrode of the selection transistor 108c, so that a signal amplified by the amplification transistor 108a is outputted to the column signal line 141.

Also, a predetermined voltage is applied to the gate electrode of the reset transistor 108b after the signal is read out, so that the charge storage region 104 is set to a reset voltage.

In the present embodiment, the contact plug 107 is formed, and then the n-type impurity diffusion layer 105 is formed by annealing. This makes it possible to bring a contact resistance between the contact plug 107 and the charge storage region 104 to a level lower than that in the case of forming no impurity diffusion layer 105.

It should be noted that the impurity diffusion layer 105 is not necessarily formed as long as the contact resistance between the contact plug 107 and the charge storage region 104 fails within an allowable range.

As illustrated in FIG. 2A, the p-type semiconductor layer 103 is formed so as to surround the contact plug 107 in the plan view of the solid-state imaging device and to contact an upper portion of the charge storage region 104. With this configuration, the charge storage region 104 is of an embedded type, so that holes present in the p-type semiconductor layer 103 can reduce a leak current caused by electrons generated from the n-type charge storage region 104, making it possible to suppress a noise generated in the charge storage region 104. Incidentally, the semiconductor layer 103 produces a larger effect of suppressing the leak current in keeping with an increase in the area covering the charge storage region 104. However, when the high-concentration impurity diffusion layer 105 and a region of the high-concentration p-type semiconductor layer 103 contact each other, a resultant high electric field intensity tends to cause leaks. Thus, is appropriate that they do not contact each other.

Incidentally, "in the plan view of the solid-state imaging device" in the present specification refers to a state in which the solid-state imaging device is seen from a direction normal to a light-receiving surface of the photoelectric conversion unit 111 as illustrated later in FIG. 3, namely, a state in which the solid-state imaging device is seen from above.

In the present embodiment, since the gate electrode of the amplification transistor 108a and the contact plug 107 can be electrically connected via the line 107a, no line for connecting the gate electrode of the amplification transistor 108a and the charge storage region 104 need be disposed in a layer of a line 112a (a metal wiring layer). Accordingly, there is no restriction imposed by a layout rule, so that lines need not be layered, making it possible to suppress an increase in the number of wiring layers. Thus, this configuration is also advantageous for achieving a finer design.

Also, as illustrated in FIG. 2A, a height h1 of a connection surface between the line 107a and the contact plug 107 from an upper surface of the semiconductor substrate 101 is greater than a height h2 of a bottom surface of the gate electrode of the amplification transistor 108a from the upper surface of the semiconductor substrate 101. With this configuration, a parasitic capacitance between the semiconductor substrate 101 and the line 107a can be reduced. Even when the charge generated according to the amount of light received in the photoelectric conversion film 114 varies the voltage of the line 107a, a conversion gain of the amplification transistor 108a varies, making it possible to prevent a charge output of the charge storage region 104 from containing a noise.

Also, as illustrated in FIG. 2A, the height h1 of the connection surface between the line 107a and the contact plug 107 from the upper surface of the semiconductor substrate 101 is less than a height h3 of an upper surface of the gate electrode of the amplification transistor 108a from the upper surface of the semiconductor substrate 101. With this configuration, since the distance between the charge storage region 104 and the line 107a is small, it is possible to enhance a light-shielding property against light that is not completely absorbed by and pass through the photoelectric conversion film 114, so that light entering the charge storage region 104 can be blocked effectively. Since the light entering the charge storage region 104 may cause a noise in the charge storage region 104, the above configuration is effective for reducing the noise.

Furthermore, as illustrated in FIG. 2A, the line 107a covers a portion of the element isolation region 102 adjacent to the charge storage region 104 in the plan view of the solid-state imaging device. With this configuration, since an area in which the line 107a shields the charge storage region 104 from light increases, the light-shielding property can be enhanced, making it possible to suppress the generation of a noise charge in the charge storage region 104 owing to the incident light.

Moreover, as illustrated in FIG. 2B, the gate electrode of the amplification transistor 108a and the line 107a may be formed in such a manner as to contact each other via no contact plug 107b. With such a configuration, it becomes possible to not only produce the effect obtained with the configuration illustrated in FIG. 2A but also reduce the thickness of the insulating layer 109a. Additionally, unlike the case in which the gate electrode of the amplification transistor 108a and the line 107a contact each other via the contact plug 107b, the area in which they contact each other can be increased, making it possible to reduce the contact resistance.

Figure 3:
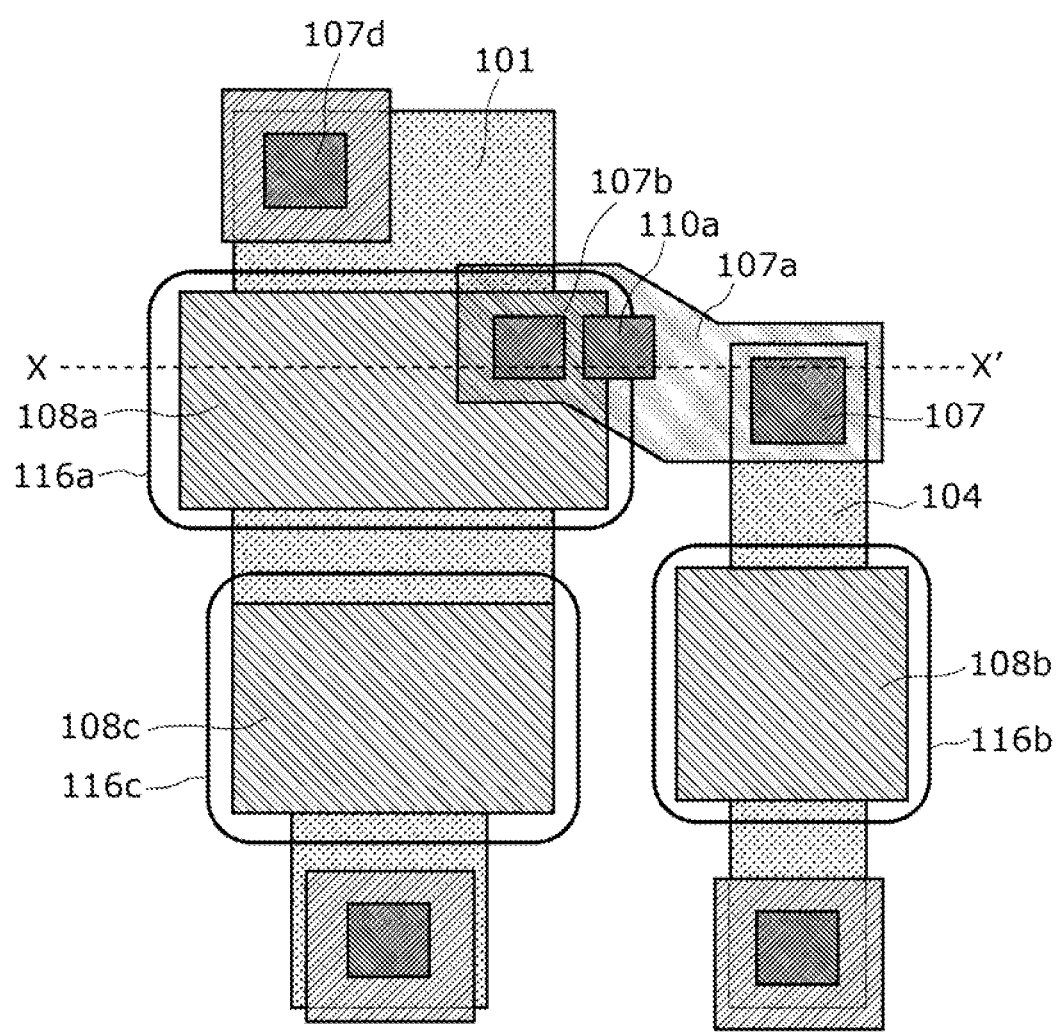
FIG. 3 illustrates an example of a plan view showing a pixel of a solid-state imaging device according to an embodiment.

FIG. 3 illustrates an example of a plan view showing a pixel of the solid-state imaging device according to an embodiment. This figure is a plan view illustrating a configuration including the charge storage region 104, the amplification transistor 108a, the reset transistor 108b and the selection transistor 108c included in the pixel 11 of the solid-state imaging device according to the present embodiment. Incidentally, FIG. 2A is a sectional view taken along a line X-X' in FIG. 3.

As illustrated in FIG. 3, lateral surfaces of the reset transistor 108b are covered with the sidewall layer 116b. The sidewall layer 116b of the gate electrode of the reset transistor 108b is disposed so as not to overlap the contact plug 107 in the plan view of the solid-state imaging device. If the sidewall layer 116b of the gate electrode of the reset transistor 108b overlaps the contact plug 107 in the plan view of the solid-state imaging device, the area of the bottom surface of the contact plug 107 varies among pixels or decreases, so that the noise in the charge storage region 104 increases. On the other hand, with this configuration, the area of the bottom surface of the contact plug 107 can be secured, making it possible to suppress an increase in the contact resistance. Consequently, an increase in the noise in the charge storage region 104 can be suppressed.

Furthermore, the gate oxide film for the amplification transistor 108a, the gate oxide film for the reset transistor 108b, and the gate oxide film for the selection transistor 108c may have the same thickness in a single pixel illustrated in FIG. 3. With this configuration, it is possible to simplify a process of forming the gate oxide films. It should be noted that "the same" referred to herein means "substantially the same," namely, includes a manufacturing error.

Figure 4:
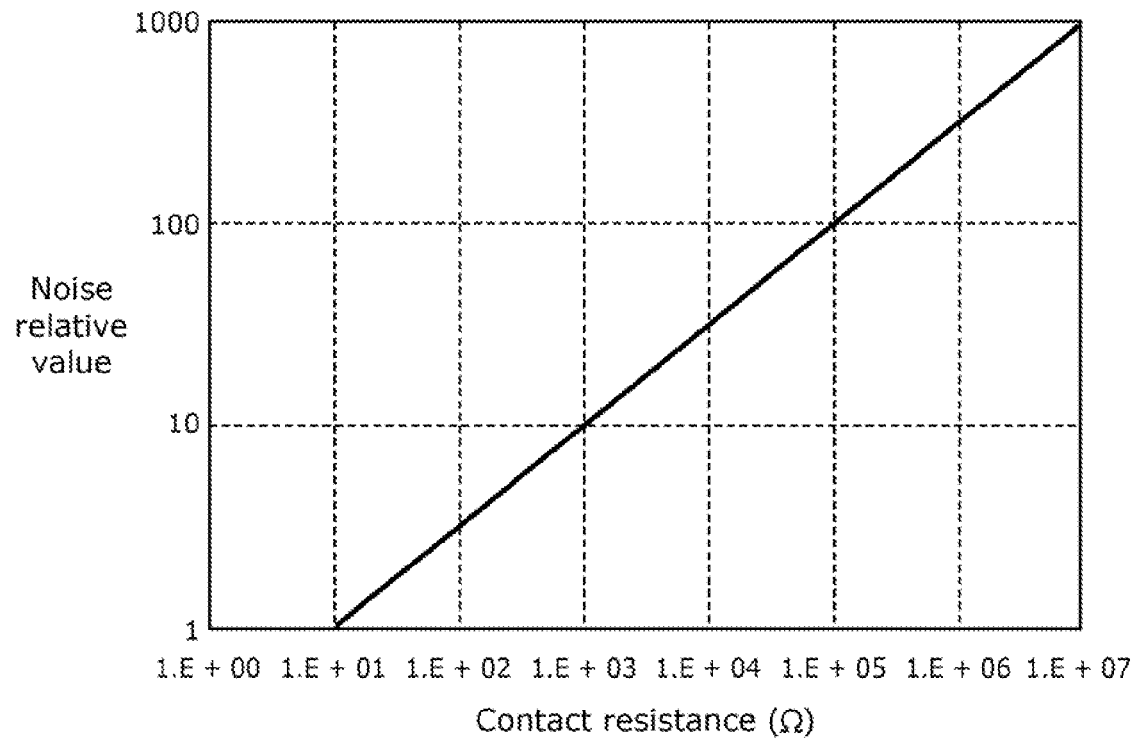
FIG. 4 is a graph showing a relative value of a noise with respect to a variation of a contact resistance according to an embodiment.

FIG. 4 is a graph showing a relative value of a noise with respect to a variation of a contact resistance according to an embodiment. In this figure, a horizontal axis indicates the contact resistance between the charge storage region 104 and the contact plug 107, and a vertical axis indicates the relative value of the noise. When the value of the contact resistance increases by two orders of magnitude, the noise also increases by an order of magnitude. In the present embodiment, since the contact resistance can be reduced, it is possible to suppress the noise generated in the charge storage region 104.

Also, the charge storage region 104 and the contact plug 107 are of the same conductivity type, and the impurity concentration of the contact plug 107 is higher than that of the charge storage region 104. With this configuration, it is possible to reduce a potential barrier present between the charge storage region 104 and the contact plug 107. Thus, the contact resistance between the charge storage region 104 and the contact plug 107 can be reduced further. Moreover, even with the reduced impurity concentration of the charge storage region 104, the contact resistance can be reduced. Accordingly, it is possible to achieve an effect of reducing a leak current owing to the concentration reduction in the charge storage region 104, so that the noise in the charge storage region 104 can be suppressed.

The impurity concentration of the charge storage region 104 is typically from $10^{16}/cm^3$ to $10^{18}/cm^3$. The impurity concentration of the impurity diffusion layer 105 is typically from $10^{18}/cm^3$ to $10^{20}/cm^3$. The impurity concentration of the contact plug 107 is typically from $10^{19}/cm^3$ to $10^{21}/cm^3$.

FIGS. 5A to 5E are schematic views illustrating steps of forming the contact plug according to an embodiment. FIGS. 5A to 5E illustrate an example of the steps of forming the contact plug 107, the line 107a and the contact plug 107b illustrated in FIG. 2A.

Figure 5A:
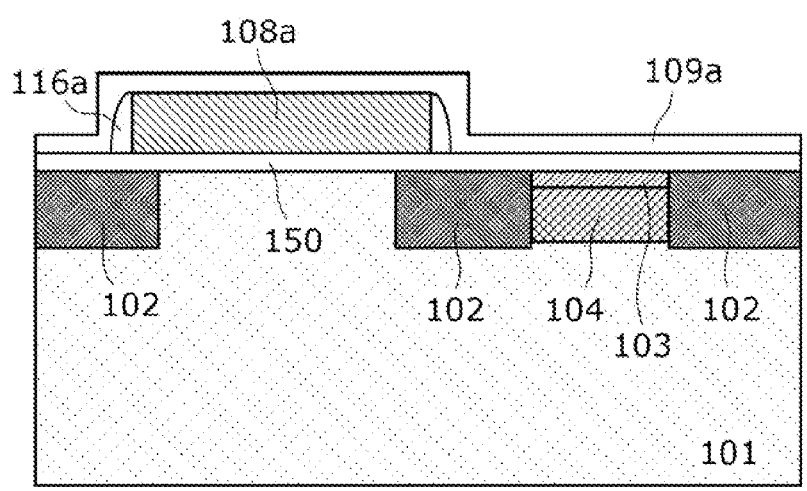
FIG. 5A is a schematic view illustrating a first step of forming a contact plug according to an embodiment.

First, as illustrated in FIG. 5A, a portion of the insulating layer 109a is deposited above the amplification transistor 108a and the gate oxide film 150 by sputtering or a CVD method.

Figure 5B:
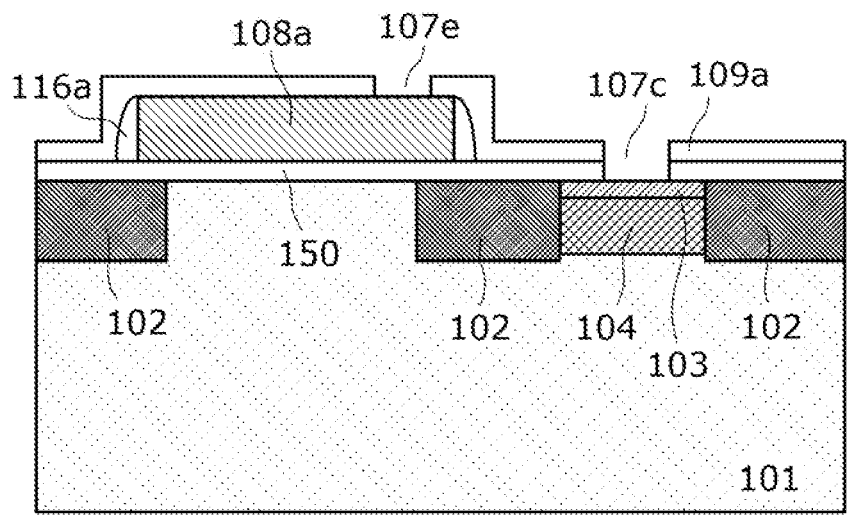
FIG. 5B is a schematic view illustrating a second step of forming the contact plug according to an embodiment.

Thereafter, as illustrated in FIG. 5B, a contact hole 107c is formed in a portion of the insulating layer 109a where the contact plug 107 is to be formed, and a contact hole 107e is formed in a portion of the insulating layer 109a where the contact plug 107b is to be formed.

Figure 5C:
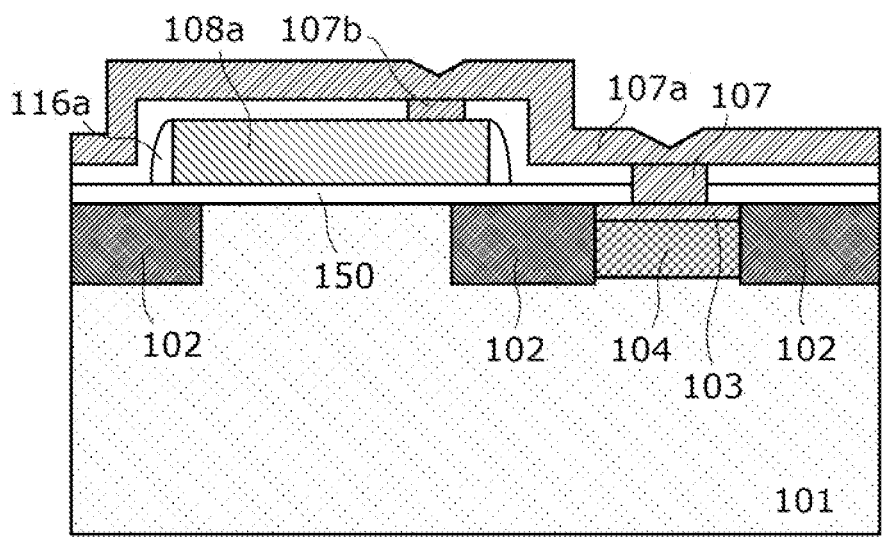
FIG. 5C is a schematic view illustrating a third step of forming the contact plug according to an embodiment.

Subsequently, as illustrated in FIG. 5C, polysilicon having impurities at a high concentration is deposited by a CVD method or sputtering. Incidentally, at this time, upper sections of the portions where the contact holes 107c and 107e were present have a cross-section that is slightly dented.

Figure 5D:
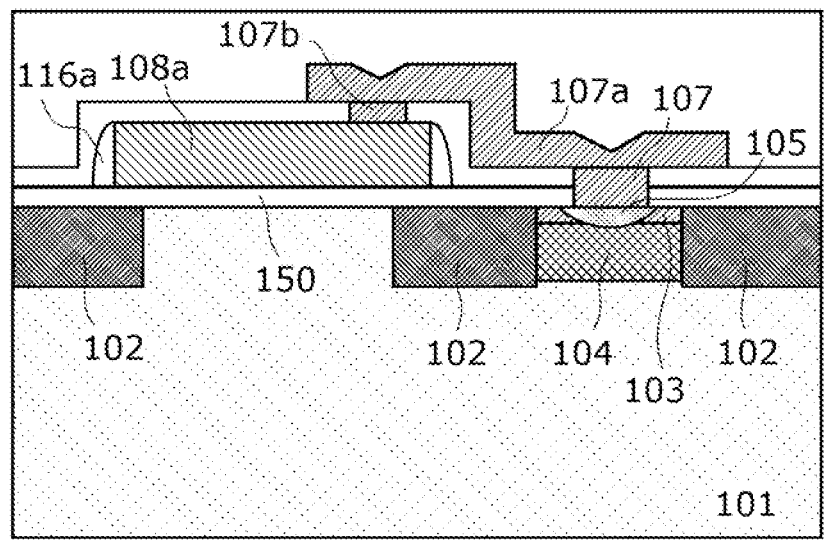
FIG. 5D is a schematic view illustrating a fourth step of forming the contact plug according to an embodiment.

Thereafter, as illustrated in FIG. 5D, the polysilicon is removed by etching while leaving only a necessary region by lithography. In some cases, a gap formed when depositing the polysilicon is present in a central portion of the contact plug 107. Incidentally, in the configuration illustrated in FIG. 2B, the contact plug 107b is not formed at this stage, and the line 107a is formed in such a manner as to contact the gate electrode of the amplification transistor 108a.

Figure 5E:
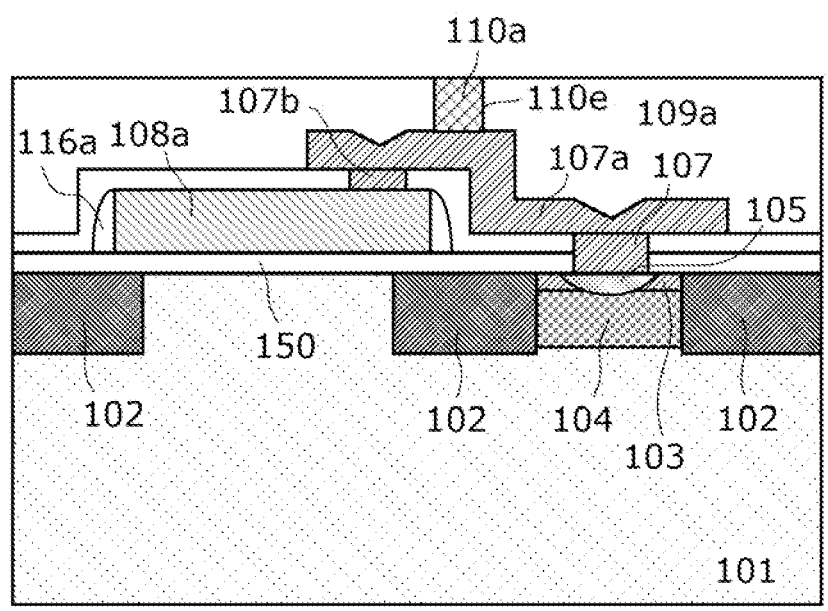
FIG. 5E is a schematic view illustrating a fifth step of forming the contact plug according to an embodiment.

Next, as illustrated in FIG. 5E, the contact hole 110e is formed. On the upper surface of the line 107a, the contact plug 110a electrically connecting to the line 107a is not disposed directly above the contact plug 107. The contact plug 110a is formed of a metallic material such as W, Cu or Al.

When the gap is formed in the central portions of the contact plug 107 and the contact plug 107b in the process of FIG. 5D, if the contact plug 110a was disposed directly above the contact plug 107 or the contact plug 107b, a damage caused by dry etching at the time of forming the contact hole 110e would be introduced to the charge storage region 104 through the gap formed in the central portions of the plugs. In order to avoid a noise owing to this damage caused by dry etching, it is appropriate that the contact plug 110a should not be disposed directly above the contact plug 107 or the contact plug 107b.

Imaging Apparatus Utilizing the Present Embodiment

The following is a description of an imaging apparatus (a camera) including the solid-state imaging device described in the embodiment described above.

Figure 6:
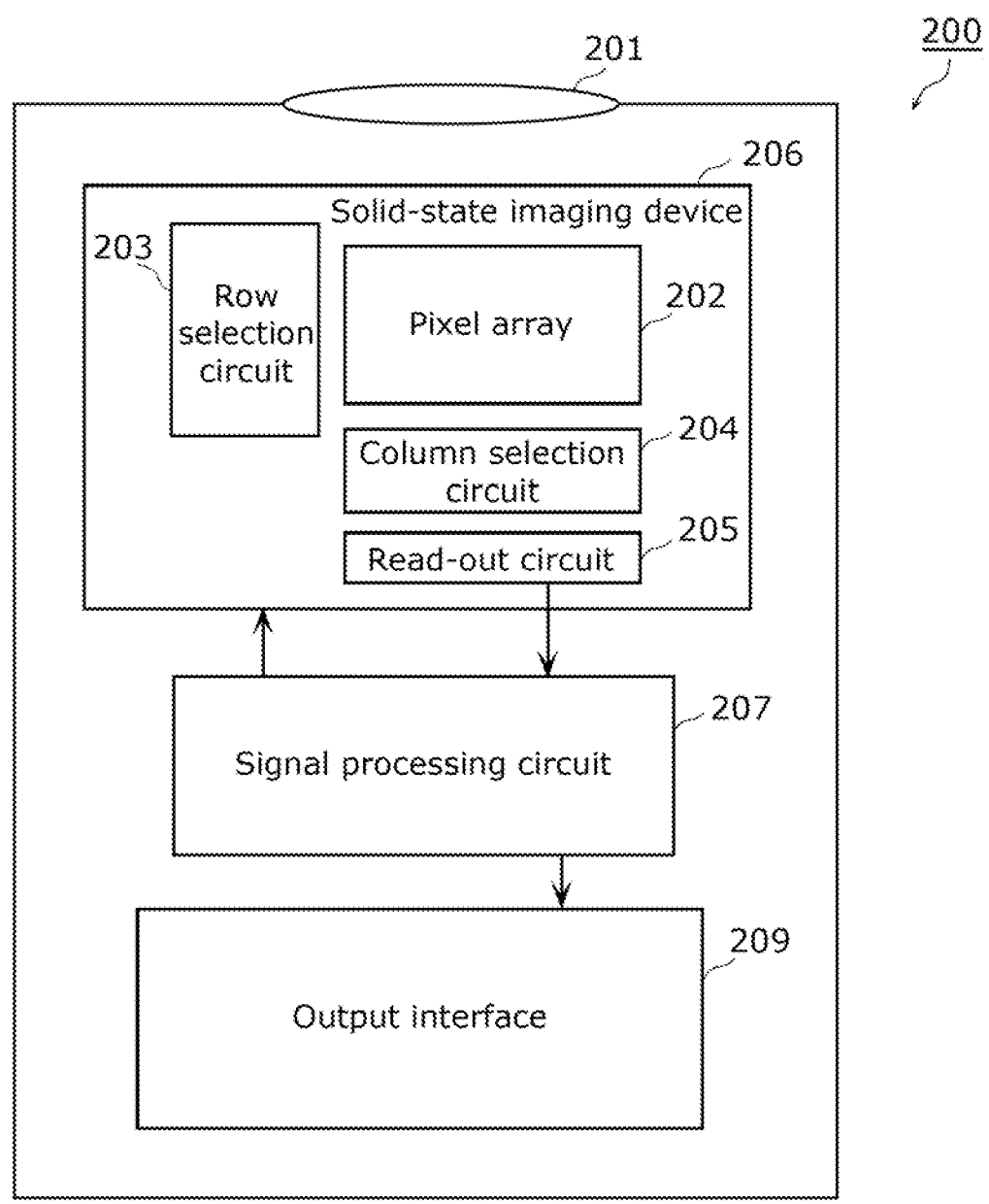
FIG. 6 is a block diagram illustrating an overall configuration of an imaging apparatus including a solid-state imaging device according to an embodiment.
Figure 7:
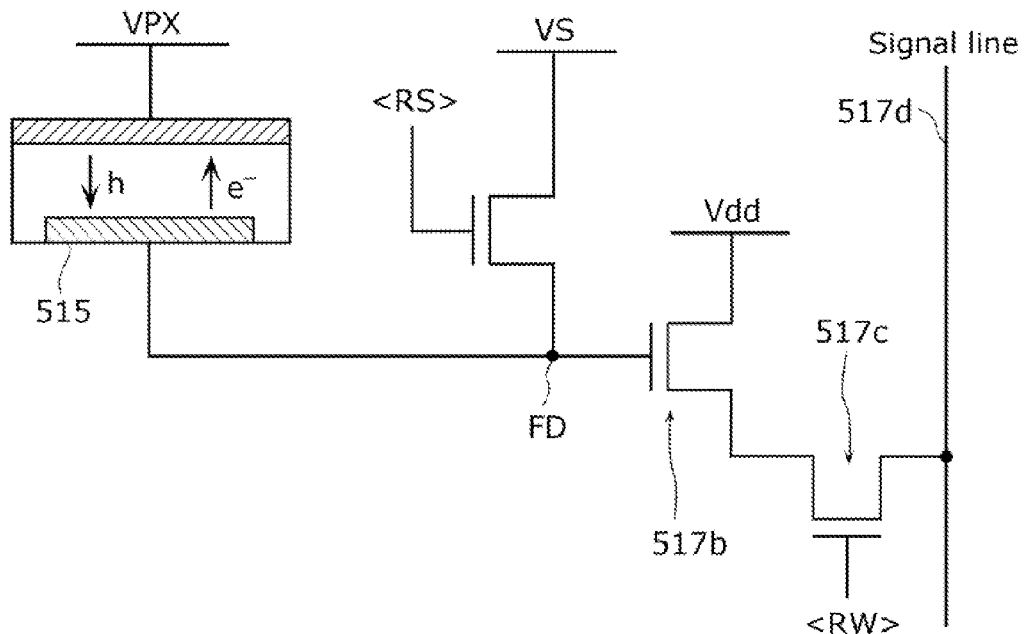
FIG. 7 is a pixel circuit diagram illustrating a layered solid-state imaging device described in PTL 1.
Figure 8:
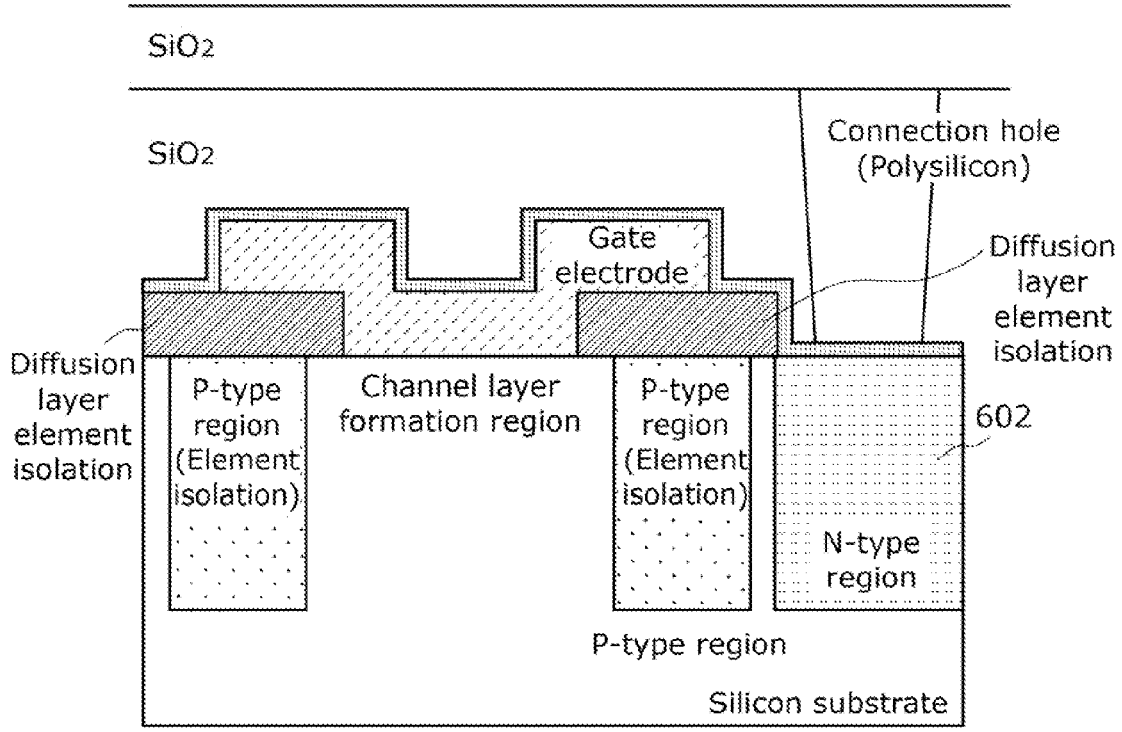
FIG. 8 is a sectional view illustrating a pixel portion of a solid-state imaging device described in PTL 2.

FIG. 6 is a block diagram illustrating an overall configuration of the imaging apparatus including the solid-state imaging device according to an embodiment. An imaging apparatus 200 according to the present embodiment includes a lens 201, a solid-state imaging device 206, a signal processing circuit 207, and an output interface 209.

The solid-state imaging device 206 is any of the solid-state imaging devices described in the above embodiment. Also, the above-mentioned plurality of pixels 11 are disposed in a matrix in a pixel array 202. A row selection circuit 203 and a column selection circuit 204 correspond to the vertical scanning unit 13 and the horizontal scanning unit 15 illustrated in FIG. 1.

The lens 201 forms an image of a subject on the pixel array 202. Signals obtained in the pixel array 202 are sequentially transferred through the row selection circuit 203, the column selection circuit 204, and a read-out circuit 205 to the signal processing circuit 207. The signal processing circuit 207 performs signal processing on the received signal, and outputs the image signal that has been subjected to the signal processing to the output interface 209 including a display and a memory.

The use of the solid-state imaging device according to the present embodiment makes it possible to provide a low-cost camera that involves less noise and achieves a high image quality.

Although the above description has been directed to the solid-state imaging device and the imaging apparatus according to an embodiment, the present disclosure is not limited to this embodiment.

For example, the p-type semiconductor substrate 101 in the above description may be replaced with a p-type well formed in the semiconductor substrate 101.

Furthermore, the solid-state imaging device according to the embodiment described above is typically implemented as an LSI, which is an integrated circuit. Such a solid-state imaging device may be individually made into a single chip or may be partially or entirely made into a single chip.

Furthermore, ways to achieve circuit integration are not limited to the LSI, and a dedicated circuit or a general purpose processor can also achieve the integration. It may also be possible to utilize a field programmable gate array (FPGA) that can be programmed after the LSI production or a reconfigurable processor that can reconfigure the connection and settings of a circuit cell inside the LSI.

Moreover, in the sectional views illustrated above, a corner and a side of each structural component have been indicated linearly. However, the present disclosure also includes a corner and a side that are rounded due to manufacturing reasons.

Also, functions of the solid-state imaging device, the imaging apparatus, and variations thereof according to the embodiment described above may be at least partially combined.

Moreover, all of the numerals used above are examples for specifically describing the present disclosure, and the present disclosure is by no means limited to these numerals. The n-type and p-type of the contact plug 107, the impurity region of the charge storage region 104, etc. are mere examples for specifically describing the present disclosure, and can be reversed to obtain an equivalent result. Also, all of the above-noted materials of the individual structural components are mere examples for specifically describing the present disclosure, and by no means limit the present disclosure. The connections between the structural components are mere examples for specifically describing the present disclosure, and by no means limit the connections achieving the function of the present disclosure.

Further, how the functional blocks are divided in the block diagram is merely exemplary. It may also be possible to realize a plurality of functional blocks as one functional block, divide one functional block into plural functional blocks, or transfer part of the function to another functional block. In addition, single hardware or software may process the functions of plural functional blocks having similar functions in parallel or by time division.

Although the above description has been directed to an example of using the MOS transistor, other transistors may also be used.

Furthermore, the present disclosure also includes many variations of the embodiment described above within the range conceivable by a person skilled in the art without departing from the purport of the present disclosure.

Although only exemplary embodiment has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is applicable to a solid-state imaging device. The present disclosure is also applicable to an imaging apparatus such as a digital still camera, a digital video camera, a cellular phone camera, or a surveillance camera including a solid-state imaging device.

The invention claimed is:

1. A solid-state imaging device comprising:
a semiconductor substrate;
a plurality of pixels that is disposed in a matrix above the semiconductor substrate;
a pixel electrode that is disposed in each of the pixels and electrically isolated from an adjacent one of the pixels;
a photoelectric conversion film that is disposed above the pixel electrode and performs photoelectric conversion of light into a signal charge;
a charge storage region that is disposed in each of the pixels, is electrically connected to the pixel electrode, and stores the signal charge obtained through the photoelectric conversion in the photoelectric conversion film;
an amplification transistor that is disposed in each of the pixels and amplifies the signal charge stored in the charge storage region in a corresponding one of the pixels;
a first contact plug that comprises a semiconductor material having semiconducting properties;
a line that is disposed above the first contact plug and the charge storage region and comprises a semiconductor material having semiconducting properties; and
an element isolation region that is adjacent to the charge storage region,
wherein the first contact plug and the charge storage region are electrically connected,
the first contact plug and a gate electrode of the amplification transistor are electrically connected via the line,
the line is disposed so as to cover at least a portion of the charge storage region in a plan view of the solid-state imaging device,
the charge storage region includes an impurity diffusion layer in direct contact with the first contact plug,
a concentration of impurities determining a conductivity type of the impurity diffusion layer is higher than a concentration of impurities determining a conductivity type of a region, other than the impurity diffusion layer, included in the charge storage region, and
the line is disposed so as to cover a portion of the element isolation region in the plan view of the solid-state imaging device.

2. The solid-state imaging device according to claim 1, further comprising:
a gate electrode of a reset transistor that resets the charge storage region; and
a sidewall layer that covers a lateral surface of the gate electrode of the reset transistor,
wherein the sidewall layer is disposed without overlapping the first contact plug in the plan view of the solid-state imaging device.

3. The solid-state imaging device according to claim 1, further comprising
a second contact plug that is electrically connected to the line on an upper surface of the line,
wherein the second contact plug is disposed so as to avoid a portion directly above the first contact plug in a sectional view of the solid-state imaging device.

4. The solid-state imaging device according to claim 1, wherein a height of a connection surface between the line and the first contact plug from an upper surface of the semiconductor substrate is greater than a height of a bottom surface of the gate electrode of the amplification transistor from the upper surface of the semiconductor substrate.

5. The solid-state imaging device according to claim 4, wherein the height of the connection surface between the line and the first contact plug from the upper surface of the semiconductor substrate is less than a height of an upper surface of the gate electrode of the amplification transistor from the upper surface of the semiconductor substrate.

6. The solid-state imaging device according to claim 3, wherein the second contact plug comprises a metallic material.

7. The solid-state imaging device according to claim 2, wherein a gate oxide film for the amplification transistor and a gate oxide film for the reset transistor have a same thickness.

8. The solid-state imaging device according to claim 1, wherein the charge storage region is an $n^-$-type charge storage region.

9. A solid-state imaging device comprising:
a semiconductor substrate;
a plurality of pixels that is disposed in a matrix above the semiconductor substrate;
a pixel electrode that is disposed in each of the pixels and electrically isolated from an adjacent one of the pixels;
a photoelectric conversion film that is disposed above the pixel electrode and performs photoelectric conversion of light into a signal charge;
a charge storage region that is disposed in each of the pixels, is electrically connected to the pixel electrode, and stores the signal charge obtained through the photoelectric conversion in the photoelectric conversion film;
an amplification transistor that is disposed in each of the pixels and amplifies the signal charge stored in the charge storage region in a corresponding one of the pixels;
a first contact plug that comprises a semiconductor material having semiconducting properties; and
a line that is disposed above the first contact plug and the charge storage region and comprises a semiconductor material having semiconducting properties,
wherein the first contact plug and the charge storage region are electrically connected,
the first contact plug and a gate electrode of the amplification transistor are electrically connected via the line, the line is disposed so as to cover at least a portion of the charge storage region in a plan view of the solid-state imaging device, the charge storage region includes an impurity diffusion layer in direct contact with the first contact plug, and a concentration of impurities determining a conductivity type of the impurity diffusion layer is higher than a concentration of impurities determining a conductivity type of a region, other than the impurity diffusion layer, included in the charge storage region, the first contact plug and the line comprise polysilicon, the first contact plug and the line are of a same conductivity type, and the polysilicon has an impurity concentration ranging from $10^{19}/cm^3$ to $10^{21}/cm^3$.

10. The solid-state imaging device according to claim 9, wherein the charge storage region and the first contact plug are of a same conductivity type, and the first contact plug has an impurity concentration higher than an impurity concentration of the charge storage region.

11. The solid-state imaging device according to claim 10, wherein the impurity concentration of the charge storage region ranges from $10^{16}/cm^3$ to $10^{18}/cm^3$.

12. A solid-state imaging device comprising:

a semiconductor substrate;

a plurality of pixels that is disposed in a matrix above the semiconductor substrate;

a pixel electrode that is disposed in each of the pixels and electrically isolated from an adjacent one of the pixels;

a photoelectric conversion film that is disposed above the pixel electrode and performs photoelectric conversion of light into a signal charge;

a charge storage region that is disposed in each of the pixels, is electrically connected to the pixel electrode, and stores the signal charge obtained through the photoelectric conversion in the photoelectric conversion film;

an amplification transistor that is disposed in each of the pixels and amplifies the signal charge stored in the charge storage region in a corresponding one of the pixels;

a first contact plug that comprises a semiconductor material having semiconducting properties; and a line that is disposed above the first contact plug and the charge storage region and comprises a semiconductor material having semiconducting properties, wherein the first contact plug and the charge storage region are electrically connected, the first contact plug and a gate electrode of the amplification transistor are electrically connected via the line, the line is disposed so as to cover at least a portion of the charge storage region in a plan view of the solid-state imaging device, the charge storage region includes an impurity diffusion layer in direct contact with the first contact plug, a concentration of impurities determining a conductivity type of the impurity diffusion layer is higher than a concentration of impurities determining a conductivity type of a region, other than the impurity diffusion layer, included in the charge storage region, the charge storage region and the first contact plug are of a first conductivity type, the solid-state imaging device further comprises a second conductivity type semiconductor layer that is disposed so as to contact an upper portion of the charge storage region, and the second conductivity type semiconductor layer is disposed so as to surround the first contact plug in the plan view of the solid-state imaging device.

* * * * *